(12) United States Patent
Krause et al.

(10) Patent No.: US 6,586,674 B2
(45) Date of Patent: Jul. 1, 2003

(54) HERMETICALLY SEALED HOUSING

(75) Inventors: Jens Krause, Rahden (DE); Thomas Heimann, Espelkamp (DE)

(73) Assignee: Harting Automotive GmbH & Co. KG (DE)

( * ) Notice: Subject to any disclaimer, the term of this patent is extended or adjusted under 35 U.S.C. 154(b) by 0 days.

(21) Appl. No.: 10/039,678

(22) Filed: Nov. 9, 2001

(65) Prior Publication Data

US 2002/0062968 A1 May 30, 2002

(30) Foreign Application Priority Data

Nov. 29, 2000 (DE) .......................... 200 20 270

(51) Int. Cl.⁷ ................................ H05K 5/06
(52) U.S. Cl. ................ 174/50.5; 174/50; 220/3.2
(58) Field of Search ............. 174/50, 50.5, 50.51, 174/50.53, 50.54, 50.55, 52.1, 59, 17 R, 17 CT; 220/3.2, 4.01, 4.02

(56) References Cited

U.S. PATENT DOCUMENTS

| | | | | |
|---|---|---|---|---|
| 2,414,897 A | * | 1/1947 | Rickmeyer ............. 174/50.5 |
| 3,256,382 A | * | 6/1966 | Burnham et al. ........ 174/52.3 |
| 3,277,349 A | * | 10/1966 | Hyland et al. ......... 174/52.3 |
| 3,575,546 A | * | 4/1971 | Liautaud ............... 174/50 |
| 3,686,538 A | * | 8/1972 | Webster ............... 174/50.5 |
| 3,778,529 A | * | 12/1973 | Miller ................ 174/50 |
| 3,825,148 A | * | 7/1974 | Hunter et al. ......... 174/50 |
| 3,844,030 A | * | 10/1974 | Wilkinson ............ 174/50.51 |
| 3,950,603 A | * | 4/1976 | Brefka ............... 174/50 |
| 4,567,318 A | * | 1/1986 | Shu .................. 174/35 GC |
| 5,208,728 A | * | 5/1993 | Schirmer ............. 174/52.3 |
| 5,268,533 A | * | 12/1993 | Kovacs et al. ........ 174/52.4 |
| 5,497,290 A | * | 3/1996 | Fukui et al. ......... 174/52.3 |
| 6,038,129 A | * | 3/2000 | Falaki et al. ........ 361/699 |
| 6,067,229 A | * | 5/2000 | Johnson et al. ....... 361/704 |
| 6,124,400 A | * | 9/2000 | Chien ................ 525/88 |
| 6,274,810 B1 | * | 8/2001 | Tsai ................. 174/50 |
| 6,374,912 B1 | * | 4/2002 | LaGrotta et al. ...... 174/50 |

FOREIGN PATENT DOCUMENTS

| | | | |
|---|---|---|---|
| DE | 195 48 723 A1 | | 6/1997 |
| GB | 583883 | * | 2/1994 ........... 174/50 |

* cited by examiner

Primary Examiner—Dean A. Reichard
Assistant Examiner—Angel R. Estrada
(74) Attorney, Agent, or Firm—Hayes Soloway P.C.

(57) ABSTRACT

A hermetically sealed housing for power electronics includes a sheet metal tank, and an aluminum cover. The tank has a surrounding edge which is provided with a plurality of bending lugs, and the edge of the cover has a shoulder at which the bending lug rests, so that the cover is pressed against the edge of the tank and a hermetic sealing is obtained.

57 Claims, 8 Drawing Sheets

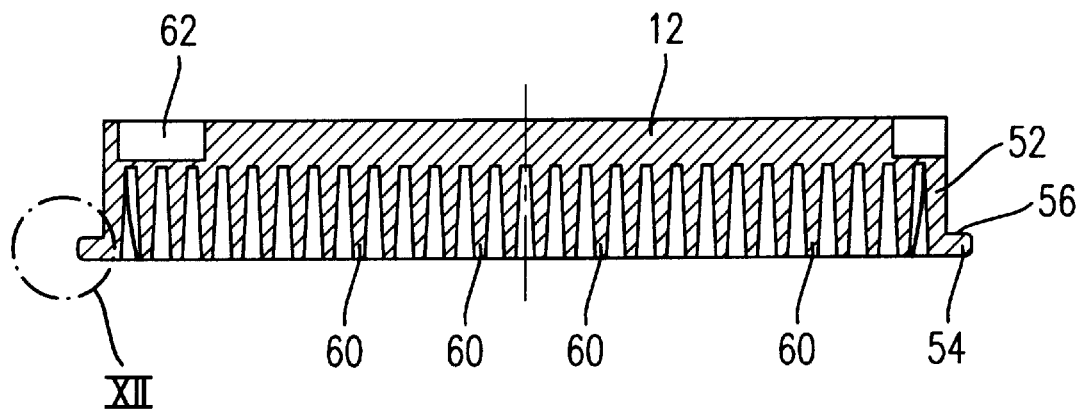
Fig. 11
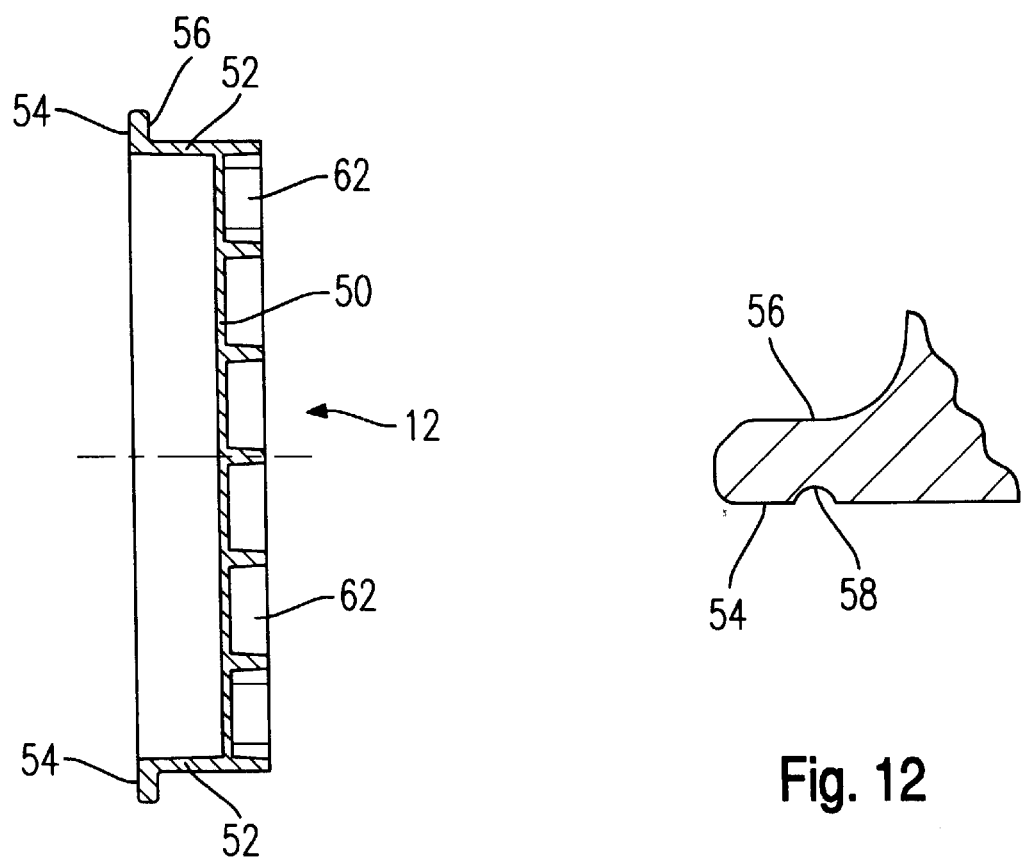
Fig. 10
Fig. 12

HERMETICALLY SEALED HOUSING

The invention relates to a hermetically sealed housing for evaporation cooling of a power electronics.

BACKGROUND OF THE INVENTION

Under the term "power electronics" an assembly unit of at least one electronic component is to be understood in this context, in which high electrical power is converted with the result that a large amount of dissipated energy or heat loss turns up. This heat loss has to be taken away reliably so that there will not occur an overheating of the power electronics. According to a preferred application of the housing according to the invention, the power electronics concerns the DC inverter of a so-called starter generator for a combustion engine of a motor vehicle, which combines the components starter and generator hitherto configured as separate parts.

When the evaporation cooling is used for cooling, the components of the power electronics are directly surrounded by a cooling liquid which is received in the housing where also the power electronics is arranged. The components to be cooled are preferably designed so as to have no housing, so that the cooling liquid has direct contact with those regions of the component where the heat loss turns up. In the case of semiconductor chips, it is the surface area of the silicon chip that is in direct contact with the cooling liquid.

The cooling liquid is selected such that it evaporates or boils during operation of the power electronics at those regions of the components where the heat loss turns up. The vapor bubbles produced rise and are condensed on cooler sections of the housing, so that they are again available for a renewed evaporation process. Such cooling method is particularly effective, because at the phase transition point of the cooling liquid from liquid to gaseous a very much larger amount of energy is absorbed as would be the case with solely a liquid cooling.

The problem with the evaporation cooling is that with each starting of the power electronics the temperature of the cooling liquid rises and, as a consequence thereof, the inner pressure in the housing. This cyclic pressure load constitutes a considerable mechanical stress acting on the housing. When such a housing is provided for being used in motor vehicles, it must be guaranteed that the housing is still hermetically sealed even after an operating period of 15 years, because otherwise a cooling of the power electronics would not be guaranteed. The housing must also be diffusion-tight, because otherwise the cooling liquid could escape from the housing despite an intact mechanical sealing.

The object of the invention is to provide a housing for a evaporation cooling of a power electronics, which is hermetically sealed for a long period and nevertheless can be produced at favorable costs with simultaneously having a low weight.

BRIEF DESCRIPTION OF THE INVENTION

To this end, there is provided a hermetically sealed housing for power electronics. The housing comprises a tank consisting of sheet metal, and a cover consisting of an aluminum material. The tank has a surrounding edge which is provided with a plurality of bending lugs, and the cover has a shoulder. The bending lugs engage at the shoulder whereby the cover is pressed against the edge of the tank so as to hermetically seal the housing. Using two different materials for the cover and the tank offers a series of advantages. Using two different materials for the cover and the tank offers a series of advantages. The tank can be manufactured from steel with low costs and with high strength and high diffusion tightness with respect to the cooling liquid, for instance as a deep-drawn sheet metal part. The latter can be provided at low expenditure with beads in the side walls and at the bottom, so that a high strength with respect to loads is obtained which result from a high internal overpressure in the housing. By using aluminum or an aluminum alloy for the cover, the latter is able to be produced with a high thermal conductivity at reasonable costs. The two parts can be connected with each other at low expenditure, namely by bending or crimping the bending lugs; the bending lugs automatically have the deformability which is required for bending, since they are part of the tank made of steel. A series of advantages result from the use of bending lugs for fixing the cover to the tank. On the one hand, this type of fixing is fail-safe. When the bending lugs are bent upwards and fix the cover to the tank, then it is ensured automatically that the two parts are pressed against each other with the necessary force, so that a good sealing effect is obtained. Unlike with a welding method, for instance, a costly subsequent check is not required. A further advantage of this type of fixing is that the power electronics disposed in the interior of the housing—as well as the cooling liquid—are not subjected to any stresses upon assembling tank and cover, and no contamination is introduced into the housing. This is not the case with a welding method, in which both a high thermal stress and a soiling of the interior of the housing occurs due to burning products. Finally, the type of fixing used is very advantageous with regard to the production costs and the production time required.

For a seal between the tank and the cover there may be advantageously used an adhesive sealing compound which is applied onto the edge of the cover or the tank and is mainly forced out of the contact gap upon assembling cover and tank. The remaining, thin layer of adhesive effects, apart from the desired sealing, a mechanical connection between tank and cover, because it is very resistant to shearing. As an alternative to the adhesive sealing compound, an O-ring seal or another profiled seal could also be used for sealing, which seal is arranged in a groove on the edge of the cover.

On its inner side facing the interior of the housing, the cover is preferably provided with a plurality of condensation ribs, so that an as large an area as possible is obtained for the heat transfer from the cooling liquid and the vapor bubbles generated in it, respectively, to the cover of the housing.

Preferably, the cover is provided on its outer side with a cooling channel running in the shape of a serpentine, so that a ducted cooling of the outer side of the cover is possible.

Advantageous designs of the invention will be apparent from the subclaims.

BRIEF DESCRIPTION OF THE DRAWINGS

The invention is described in the following by means of a preferred embodiment illustrated in the appending drawings, in which.

FIG. 10 shows the cover of FIG. 8 in a sectional view along the plane X—X of FIG. 8;

FIG. 11 shows the cover of FIG. 8 in a sectional view along the plane XI—XI of FIG. 8;

FIG. 12 shows on an enlarged scale the cut-out XII of FIG. 11; and

DETAILED DESCRIPTION OF THE INVENTION

Figure 1:
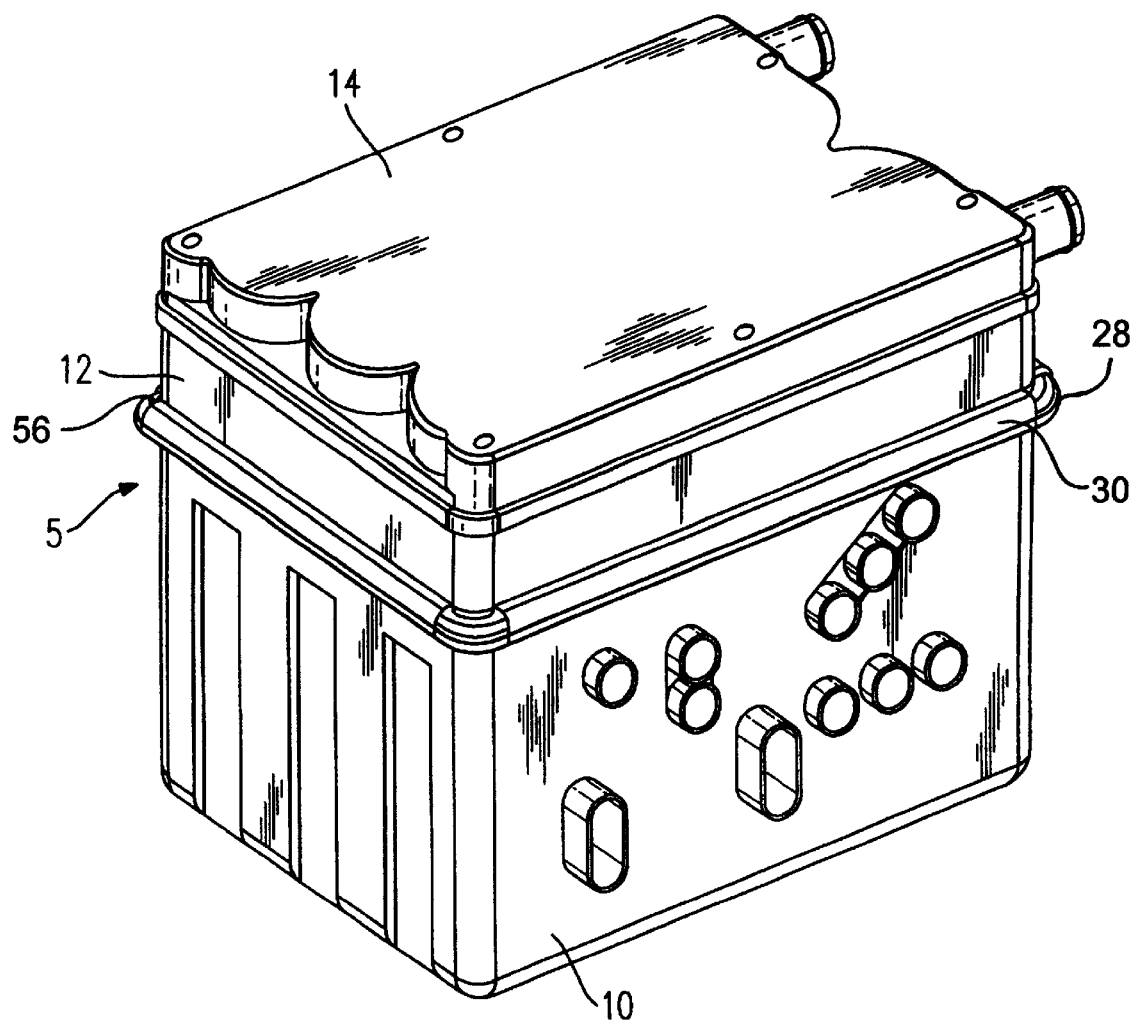
FIG. 1 shows in a perspective view a housing according to the invention.
Figure 2:
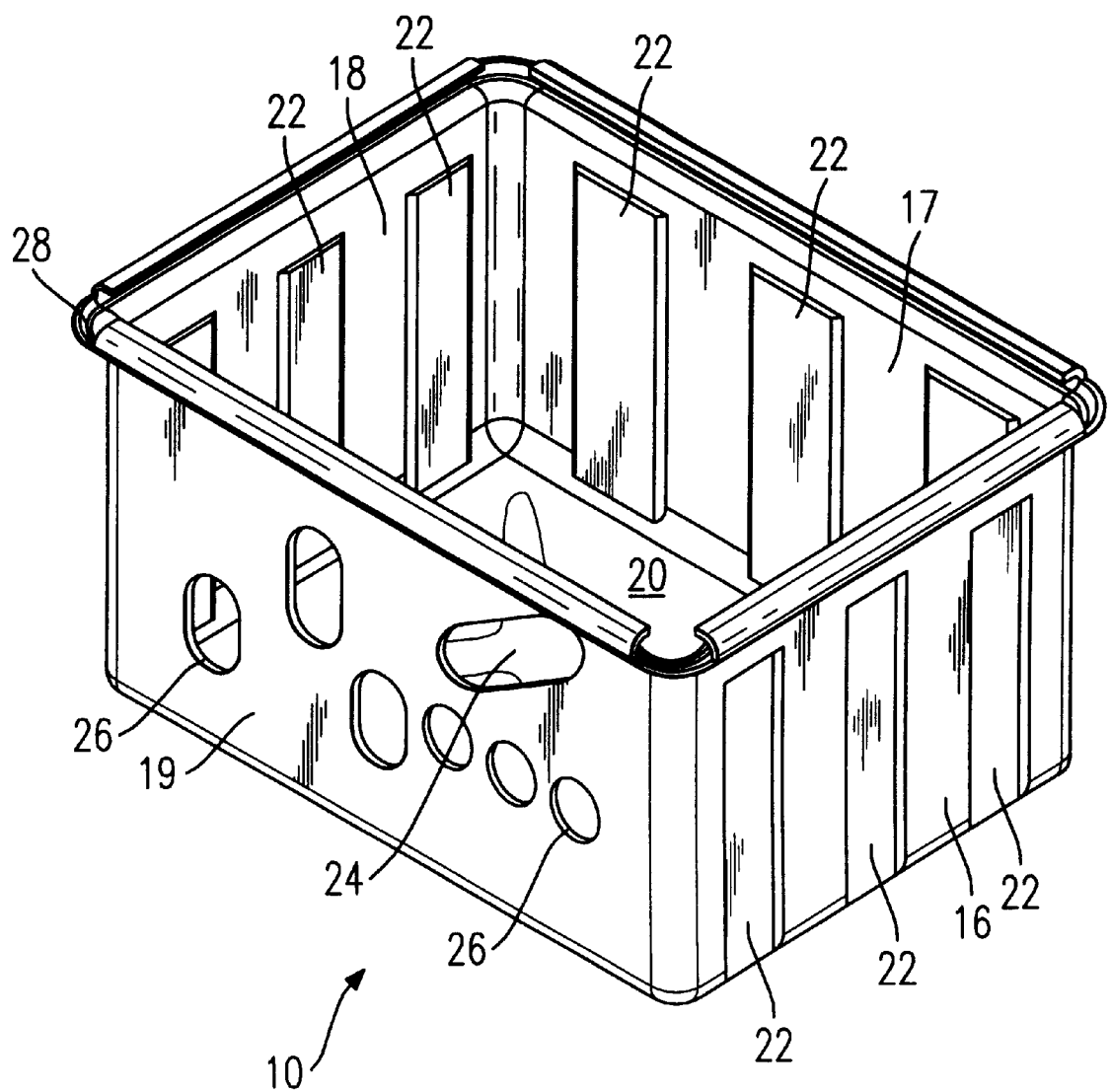
FIG. 2 shows in a perspective view a tank for the housing of FIG. 1.
Figure 3:
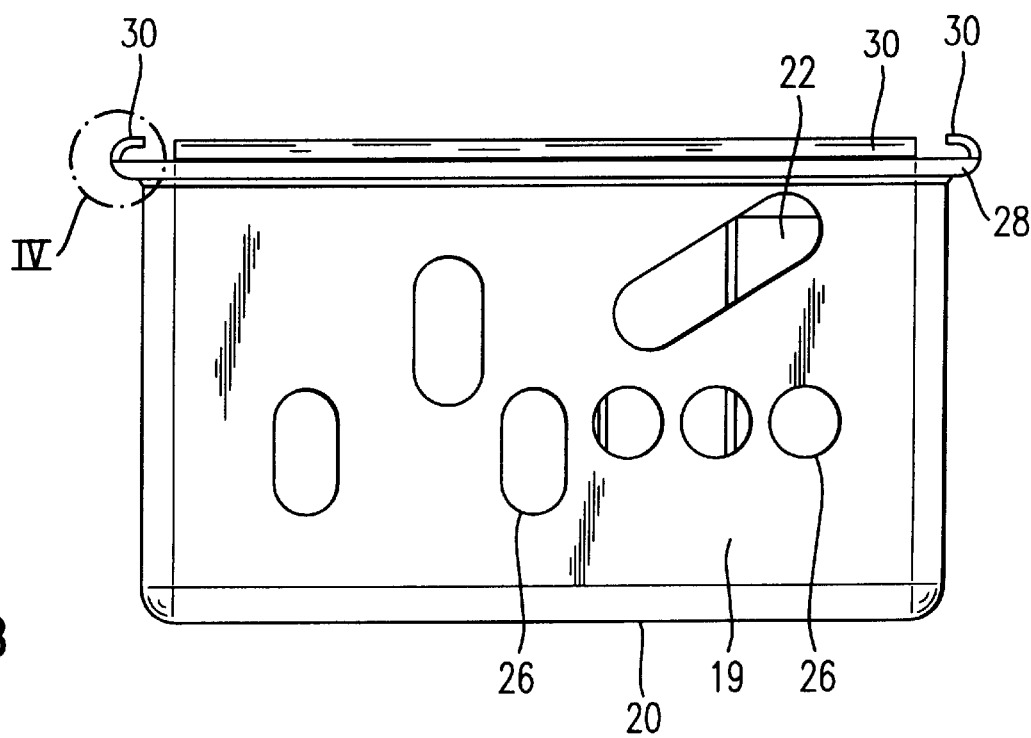
FIG. 3 shows a side view of the housing of FIG. 2.

In FIG. 1 there is shown a housing 5 which comprises a tank 10, a cover 12 as well as a covering 14 placed on the cover.

The tank 10 (see also FIGS. 2 to 6) is a deep-drawn sheet metal part with a wall thickness of about 2.5 mm and has a rectangular cross-section with four side walls 16, 17, 18, 19 and a bottom 20. The side walls 16, 17, 18 are provided with three beads 22 each, which starting from the bottom 20 extend upwards. The bottom 20 is provided with a cross bead 24. The planar side wall 19 which is not provided with a bead has a plurality of recesses 26, the function of which will be explained below.

Figure 4:
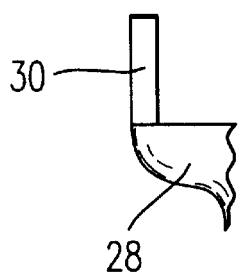
FIG. 4 shows on an enlarged scale the cut-out IV of FIG. 3.
Figure 5:
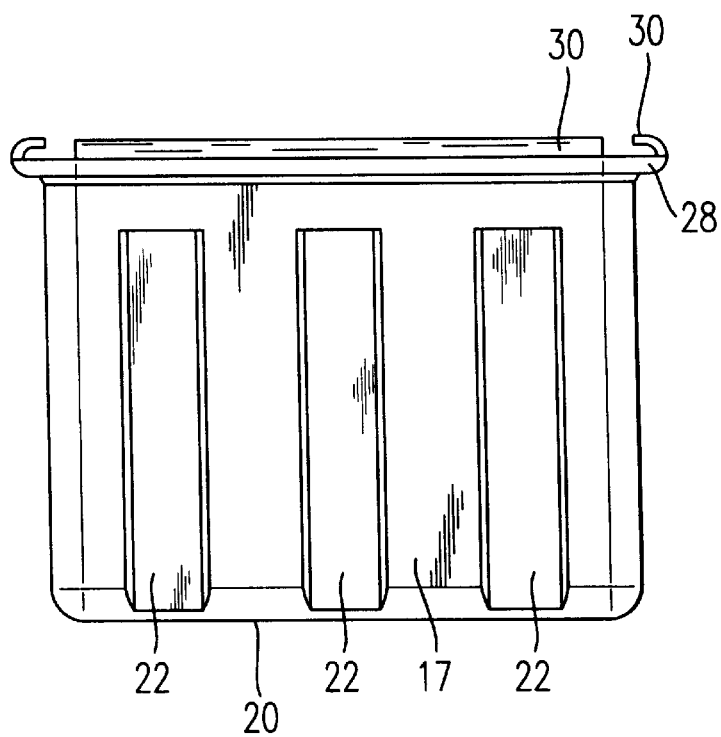
FIG. 5 shows a further side view of the housing of FIG. 2.

The tank 10 is provided with a surrounding edge 28 on its side facing away from the bottom 20, which edge is configured as a collar projecting outwards beyond the side walls. In the region of each side face, the edge 28 is provided with a bending lug 30, which are shown in FIG. 4 in their original state and in FIGS. 2, 3 and 5 in their bent shape, into which they are brought for fixing the cover to the tank. This will be explained below.

Figure 6:
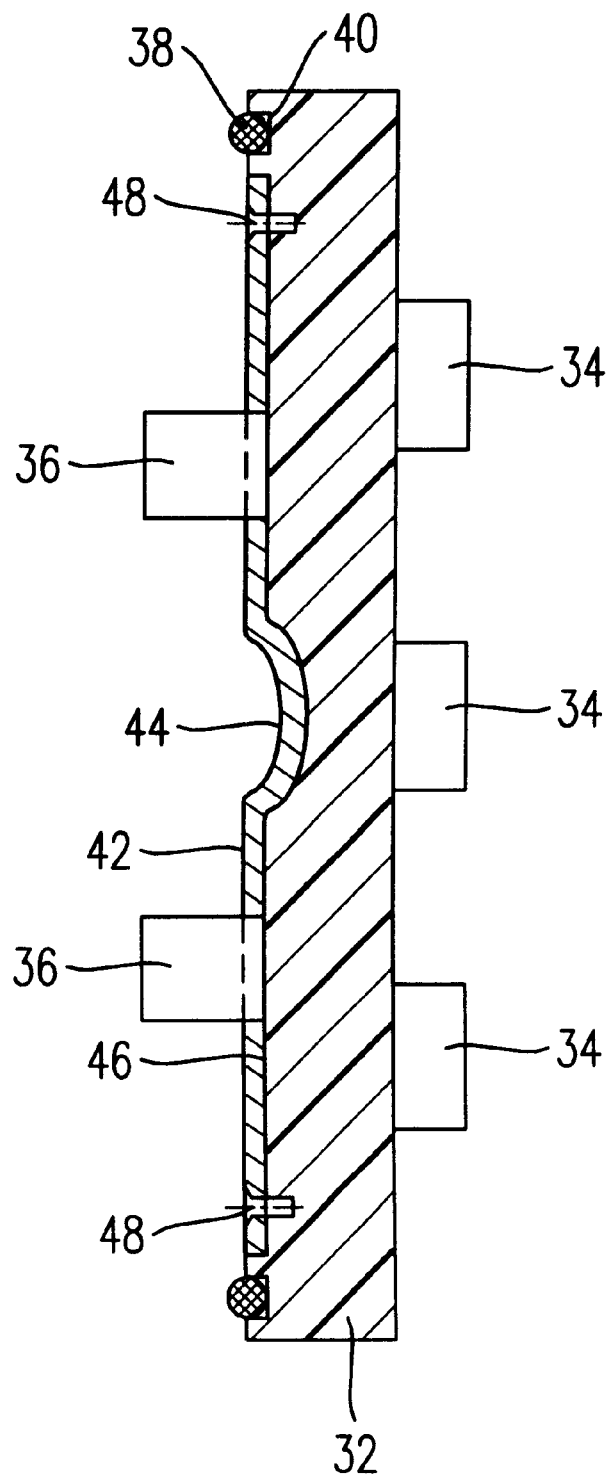
FIG. 6 shows a schematic side view of an insulating plate inserted in the housing according to the invention.

In FIG. 6 there is shown an insulating plate 32 which is rectangular and the dimensions of which correspond approximately to those of the side wall 19. The insulating plate 32 consists of an insulating plastics material, for example a semi-crystalline plastics, and bears a power electronics which is shown here only schematically by some components 34 The insulating plate 32 is provided with a plurality of current lead-throughs 36, the arrangement of which on the insulating plate 32 and the dimensions of which correspond to the arrangement and the dimensions of the recesses 26 in the side wall 19 of the tank.

The insulating plate 32 is provided with a seal 38 which is configured as an O-ring seal here; this O-ring seal is arranged in a groove 40 of the insulating plate 32. In the edge region of the insulating plate 32, the groove 40 runs around the whole insulating plate.

On the side of the current lead-throughs 36, the insulating plate 32 is provided with a reinforcement plate 42 which consists of metal and has a plurality of reinforcement beads 44. The reinforcement plate 42 is received in a depression 46 of the insulating plate 42 and is connected with the insulating plate by rivets 48 which are shown schematically here. The outline of the depression 46 corresponds to the surface area of the reinforcement plate 42 including the reinforcement bead 44 provided in it, so that the reinforcement plate 42 is received in the depression 46 with a snug fit.

The insulating plate 32 is arranged in the tank 10 on the side wall 19 such that the current lead-throughs 36 extend through the recesses 26 in the side wall; the power electronics is then situated on the inner side of the tank. With its seal 38, the insulating plate 32 rests at the side wall 19, so that the inner side of the tank is hermetically sealed with respect to the recesses 26. The insulating plate 32 may be connected with the side wall 19 by rivets not shown in the Figures or by similar fastening means.

In FIGS. 8 to 12 there is shown the cover 12 which is provided to be placed on the tank 10. The cover 12 is a cast part made from an aluminum alloy. Basically, it is also possible to bring a suitably cast blank into its final shape by extruding or a similar machining operation.

The cover 12 has the same rectangular cross-section as the tank 10 and has a cup-shaped form with a bottom wall 50 and a surrounding skirt 52. The skirt 52 has a surrounding edge 54 which is provided with a shoulder 56. On its face lying opposite the shoulder 56, the edge 52 is provided with a surrounding depot groove 58 (see FIG. 12), the function of which will be explained below.

Starting from the bottom wall 50, there extends a plurality of condensation ribs 60 between the two longer sides of the skirt 52, which ribs are formed integrally with the cover.

The cover 12 is provided with a cooling channel 62 on the side of the bottom wall 50 facing away from the edge 54, this channel extending in the shape of a serpentine. With regard to the cover 12 being easy to shape, the cooling channel 62 is configured closed, i.e. is not provided with any external connections.

Figure 7:
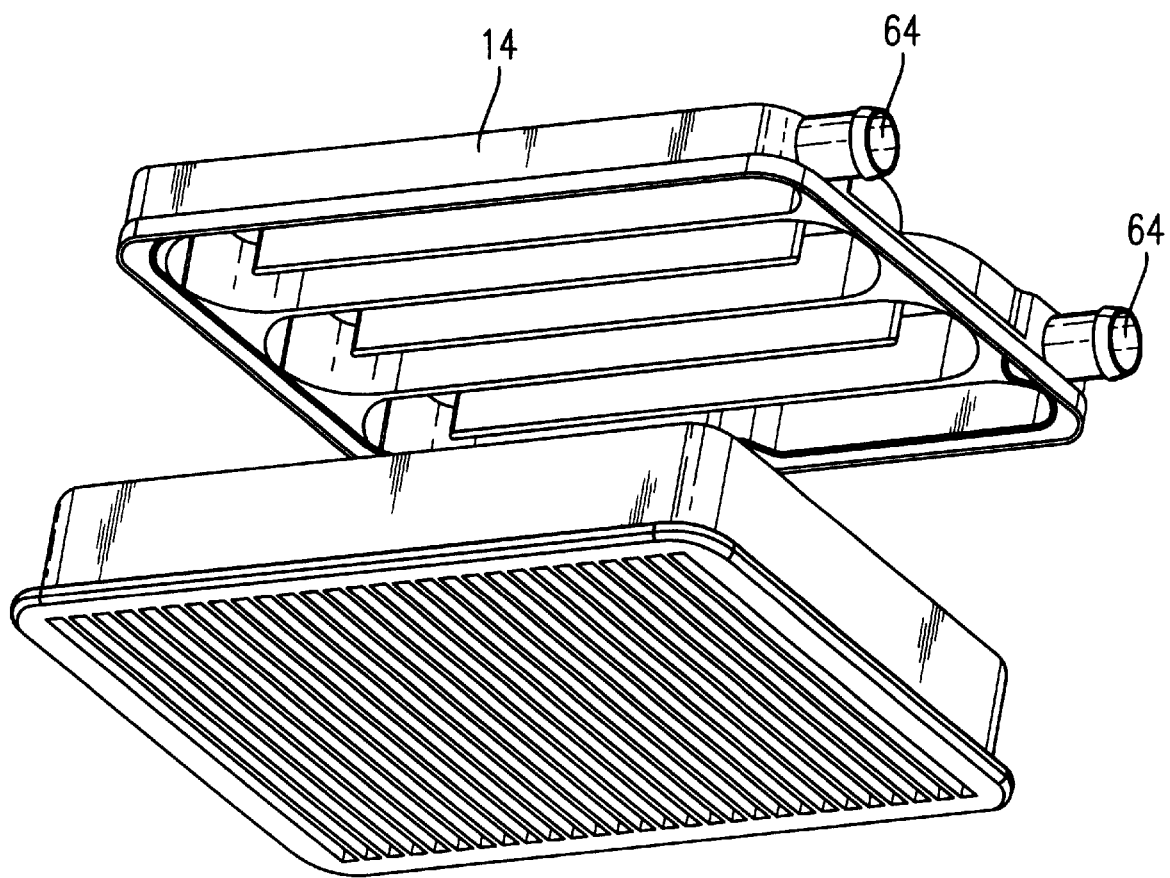
FIG. 7 shows in a perspective view the cover of the housing according to the invention together with a covering.
Figure 8:
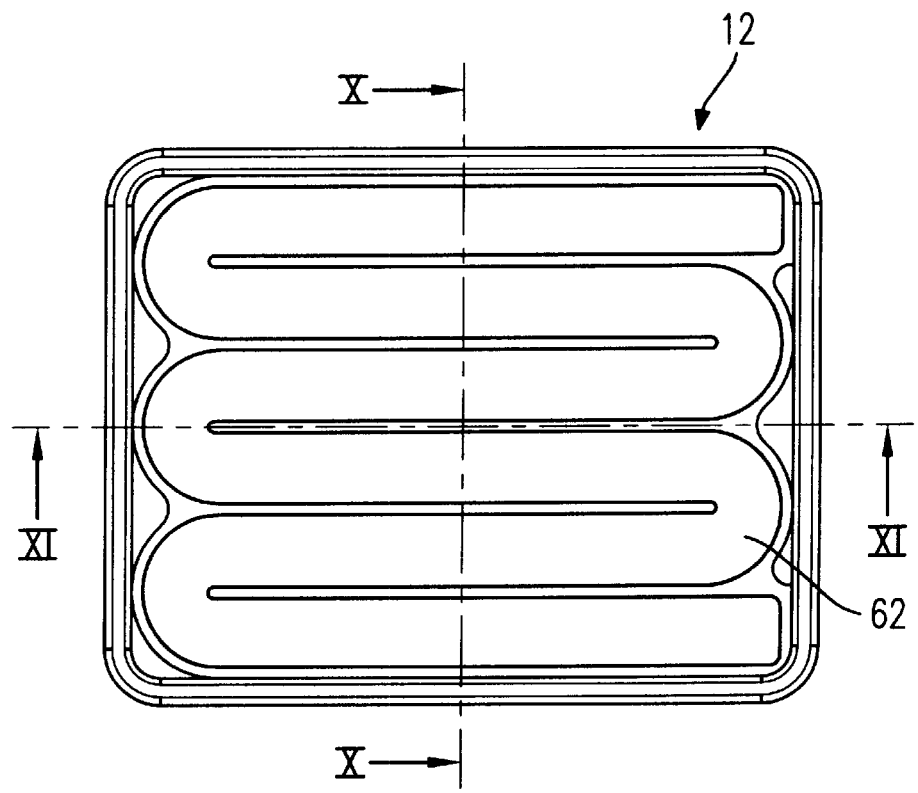
FIG. 8 shows a plan view onto the cover of FIG. 7.
Figure 9:
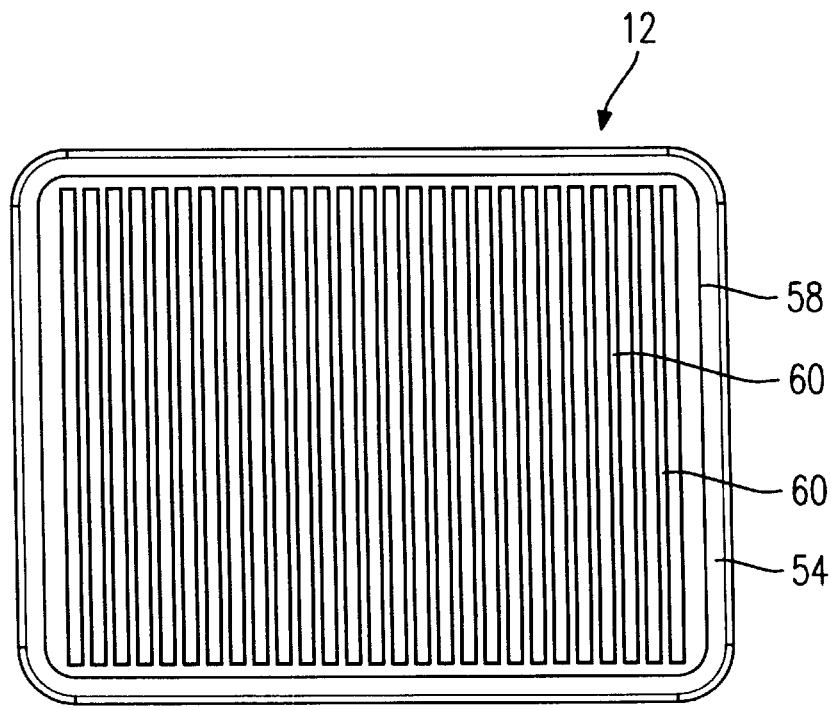
FIG. 9 shows a bottom view of the cover of FIG. 7.
Figure 13:
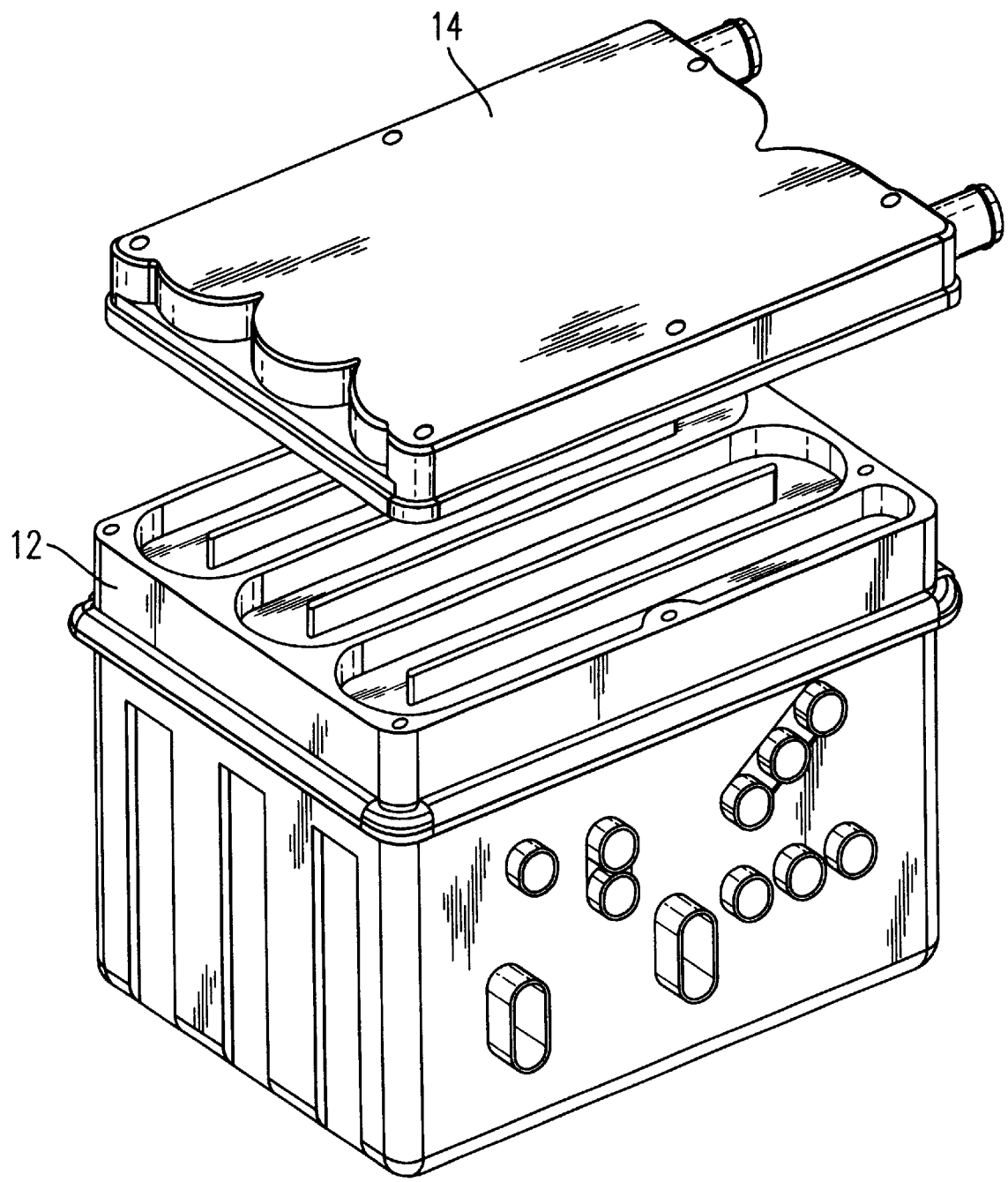
FIG. 13 shows in a perspective view the housing according to the invention during assembly.

Placed on the cover 12 is the covering 14 (see FIGS. 7 and 13) which is made of plastics. The covering 14 is likewise provided with a cooling channel having a pattern which corresponds to the pattern of the cooling channel 62 in the cover 12. The covering 14 is further provided with two connection ports 64 to which cooling conduits can be connected for piping a suitable cooling medium through the cooling channel 62 in the cover 12.

Assembling the housing takes places in the following way. First, the power electronics 34 is mounted to the insulating plate 32 provided with the reinforcement plate 42. Then the insulating plate is inserted in the tank 10 and fixed to the side wall 19, so that the seal 38 of the insulating plate 32 seals against the side wall 19. Subsequently, the tank 10 is filled with the cooling liquid which can be almost any liquid evaporating or boiling at low temperatures. Fluorohydrocarbon is particularly suitable.

An adhesive sealing compound is then applied onto the edge 54 of the cover; in so doing, the depot groove 58 being filled, too. Any adhesive for metals, by means of which steel and aluminum can be bonded and which is resistant to the cooling liquid used, is suitable as adhesive sealing compound.

Subsequently, the cover is placed with its edge 54 on the edge 28 of the tank 10 and is pressed against the tank with large force. In so doing, the adhesive sealing compound is almost completely forced out of the gap between the edge 54 of the cover and the edge 28 of the tank, so that only a thin layer of adhesive remains. In addition, the depot groove 58 is filled with the adhesive. The bending lugs 30 are then laid down from their state shown in FIG. 4 into the state which is shown for instance in FIGS. 3 and 5 as well as FIG. 13, so that they rest at the shoulder 56 of the cover 12 and hold the latter firmly on the tank 10. In this way, there results a hermetic sealing between the edges of tank and cover, which after curing of the adhesive additionally provides for a mechanical connection resistant to shearing load.

Finally, the covering 14 is applied onto the cover 12 and secured by means of fasteners.

Due to its advantageous construction a housing is obtained which can be produced at favorable costs and is hermetically sealed throughout a long service life and a great number of pressure cycles. Moreover, a high rigidity is achieved with a relatively low expenditure. Due to the beads 22, 24, the side walls 16, 17, 18 as well as the bottom 20 have a high rigidity with respect to stresses resulting from an excess pressure in the interior of the housing. The side wall 19, too, has a high rigidity, because the insulating plate 32 has a high rigidity due to the reinforcement plate 42 attached to it, and because the insulating plate 32 rests at the side wall 19 only in the outer region thereof, i.e. in the region of the bottom, of the side walls 16, 18 as well as of the edge 28. The pressure load introduced by the insulating plate 32 results, hence, only in a slight deformation of the side wall 19. The surrounding edge 28 contributes to the high rigidity of the tank by its high resistance to bending. Due to its design, the cover 10 also has a very high resistance to bending with respect to bending loads resulting from a high inner pressure of the housing. The condensation ribs 60 prevent the cover from bulging, due to they having a high resistance to bending. The skirt 52 together with the surrounding shoulder 56 contributes to a high inherent stability.

What is claimed is:

1. A hermetically sealed housing for power electronics, comprising, a tank and a cover formed of different materials, wherein said tank is formed of sheet metal, and said cover is formed of an aluminum material, said tank having a surrounding edge which is provided with a plurality of bending lugs, and said cover having a shoulder, said bending lugs engaging at said shoulder whereby said cover is pressed against said edge of said tank so as to hermetically seal said housing.

2. The housing of claim 1, wherein said tank comprises a deep-drawn sheet metal part.

3. The housing of claim 1, wherein said tank has a bottom which is provided with a cross bead.

4. The housing of claim 1, wherein said tank has four side walls, three of said side walls being provided with at least one bead.

5. The housing of claim 1, wherein said tank has four side walls, one of which side walls is provided with a plurality of recesses for current lead-throughs to said power electronics.

6. The housing of claim 1, wherein an insulating plate is arranged in the interior of said tank on a fourth wall, said power electronics being disposed on said insulating plate.

7. The housing of claim 6, wherein said insulating plate comprises a semi-crystalline plastics material.

8. The housing of claim 6, wherein said insulating plate is provided with a seal extending along an edge of said insulating plate.

9. The housing of claim 8, wherein said seal is an O-ring seal which is received in a groove.

10. The housing of claim 6, wherein said reinforcement plate is riveted to said fourth wall of said tank.

11. The housing of claim 6, wherein said insulating plate, on a side facing said fourth wall of said tank, is provided with a reinforcement plate consisting of metal.

12. The housing of claim 11, wherein said reinforcement plate is provided with a reinforcement bead which lies in a depression formed at said insulating plate.

13. The housing of claim 11, wherein said reinforcement plate is provided with openings which correspond to recesses in a fourth wall of said tank.

14. The housing of claim 11, wherein said reinforcement plate is riveted to said insulating plate.

15. The housing of claim 1, wherein said cover is formed of a cast aluminum alloy.

16. The housing of claim 1, wherein said cover is formed of a wrought aluminum alloy.

17. The housing of claim 1, wherein said cover is provided with a planar edge which lies on said edge of the tank.

18. The housing of claim 17, wherein an adhesive sealing compound is disposed between said edge of said tank and said edge of said cover.

19. The housing of claim 18, wherein said edge of said cover is provided with a depot groove for said adhesive sealing compound.

20. The housing of claim 17, wherein said edge of said cover is provided with a groove in which an O-ring seal is arranged.

21. The housing of claim 1, wherein said cover is provided on an inner side with a plurality of condensation ribs.

22. The housing of claim 1, wherein said cover is provided on an outer side with a cooling channel which extends in a shape of a serpentine.

23. The housing of claim 22, wherein said cover is provided with a covering on said outer side, said covering closing said cooling channel and being provided with two connection ports for cooling conduits.

24. The housing of claim 1, wherein said tank is formed of steel.

25. The housing of claim 23, wherein said tank comprises a deep-drawn sheet metal part.

26. The housing of claim 23, wherein said tank has a bottom which is provided with a cross bead.

27. The housing of claim 23, wherein said cover is formed of cast aluminum alloy.

28. The housing of claim 23, wherein said cover is formed of wrought aluminum alloy.

29. The housing of claim 23, wherein said cover is provided with a planar edge which lies on said edge of the tank.

30. The housing of claim 29, wherein an adhesive sealing compound is disposed between said edge of said tank and said edge of said cover.

31. The housing of claim 30, wherein said edge of said cover is provided with a depot groove for said adhesive sealing compound.

32. The housing of claim 23, wherein said tank has four side walls, three of said side walls being provided with at least one bead.

33. A hermetically sealed housing for power electronics, comprising a tank consisting of sheet metal, and a cover consisting of an aluminum material, said tank having a surrounding edge which is provided with a plurality of bending lugs, and said cover having a shoulder, said bending lugs engaging at said shoulder whereby said cover is pressed against said edge of said tank so as to hermetically seal said housing, said tank having four side walls, one of which side walls is provided with a plurality of recesses for current lead-throughs to said power electronics, and wherein an insulating plate is arranged in the interior of said tank on said one side wall, said power electronics being disposed on said insulating plate.

34. The housing of claim 33, wherein said insulating plate comprises a semi-crystalline plastics material.

35. The housing of claim 33, wherein said insulating plate is provided with a seal extending along an edge of said insulating plate.

36. The housing of claim 35, wherein said seal is an O-ring seal which is received in a groove.

37. The housing of claim 33, wherein said insulating plate, on a side facing a fourth wall of said tank, is provided with a reinforcement plate consisting of metal.

38. The housing of claim 37, wherein said reinforcement plate is provided with a reinforcement bead which lies in a depression formed at said insulating plate.

39. The housing of claim 37, wherein said reinforcement plate is provided with openings which correspond to recesses in said fourth wall of said tank.

40. The housing of claim 37, wherein a reinforcement plate is riveted to said insulating plate.

41. The housing of claim 40, wherein an edge of said cover is provided with a groove in which an O-ring seal is arranged.

42. The housing of claim 33, wherein a reinforcement plate riveted to a fourth wall of said tank.

43. The housing of claim 33, wherein said cover is provided on an inner side with a plurality of condensation ribs.

44. The housing of claim 33, wherein said cover is provided on an outer side with a cooling channel which extends in a shape of a serpentine.

45. The housing of claim 33, wherein said cover is provided with a covering on said outer side, said covering closing said cooling channel and being provided with two connection ports for cooling conduits.

46. The housing of claim 33, wherein said tank is formed of steel.

47. A hermetically sealed housing for power electronics, comprising a tank consisting of sheet metal, and a cover consisting of an aluminum material, said tank having a bottom which is provided with a cross bead, said tank further having a surrounding edge which is provided with a plurality of bending lugs, and said cover having a shoulder, said bending lugs engaging at said shoulder whereby said cover is pressed against said edge of said tank so as to hermetically seal said housing.

48. A hermetically sealed housing for power electronics, comprising a tank consisting of sheet metal, and a cover consisting of an aluminum material, said tank having four side walls, three of said side walls being provided with at least one bead, said tank further having a surrounding edge which is provided with a plurality of bending lugs, and said cover having a shoulder, said bending lugs engaging at said shoulder whereby said cover is pressed against said edge of said tank so as to hermetically seal said housing.

49. A hermetically sealed housing for power electronics, comprising a tank consisting of sheet metal, and a cover consisting of an aluminum material, said tank having a surrounding edge which is provided with a plurality of bending lugs, and said cover having a shoulder, said bending lugs engaging at said shoulder whereby said cover is pressed against said edge of said tank so as to hermetically seal said housing, said tank having four side walls, one of which side walls has an insulating plate arranged thereon in the interior of said tank, said power electronics being disposed on said insulating plate, and wherein said insulating plate is provided with a seal extending along an edge of said insulating plate.

50. The housing of claim 49, wherein said seal is an O-ring seal which is received in a groove.

51. The housing of claim 49, wherein said insulating plate, on a side facing a fourth wall of said tank, is provided with a reinforcement plate consisting of metal.

52. The housing of claim 51 wherein reinforcement is with a reinforcement bead which lies in a depression formed at said insulating plate.

53. The housing of claim 51, wherein said reinforcement plate is provided with openings which correspond to recesses in said fourth wall of said tank.

54. The housing of claim 51, wherein said reinforcement plate is riveted to said insulating plate.

55. A hermetically sealed housing for power electronics, comprising a tank consisting of sheet metal, and a cover consisting of an aluminum material, said tank having a surrounding edge which is provided with a plurality of bending lugs, and said cover having a shoulder, said bending lugs engaging at said shoulder whereby said cover is pressed against said edge of said tank so as to hermetically seal said housing, and said cover is provided on an inner side with a plurality of condensation ribs.

56. A hermetically sealed housing for power electronics, comprising a tank consisting of sheet metal, and a cover consisting of an aluminum material, said tank having a surrounding edge which is provided with a plurality of bending lugs, and said cover having a shoulder, said bending lugs engaging at said shoulder whereby said cover is pressed against said edge of said tank so as to hermetically seal said housing, and said cover is provided on an outer side with a cooling channel which extends in a shape of a serpentine.

57. The housing of claim 56, wherein said cover is provided with a covering on said outer side, said covering closing said cooling channel and being provided with two connection ports for cooling conduits.

* * * * *